United States Patent [19]

Harman

[11] Patent Number: 5,415,699
[45] Date of Patent: May 16, 1995

[54] SUPERLATTICE STRUCTURES PARTICULARLY SUITABLE FOR USE AS THERMOELECTRIC COOLING MATERIALS

[75] Inventor: Theodore Harman, Lexington, Mass.

[73] Assignee: Massachusetts Institute of Technology, Cambridge, Mass.

[21] Appl. No.: 2,451

[22] Filed: Jan. 12, 1993

[51] Int. Cl.$^6$ .................................. H01L 35/16
[52] U.S. Cl. ......................... 136/238; 136/225; 136/240; 257/22; 257/42; 257/467; 257/470; 257/930
[58] Field of Search .................. 136/200, 225, 236.1, 136/237, 239, 240, 241, 238; 257/22, 42, 108, 442, 467, 468, 469, 470, 614, 930

[56] References Cited

U.S. PATENT DOCUMENTS

| | | | |
|---|---|---|---|
| 2,588,254 | 3/1952 | Lark-Horowitz et al. | 136/89 |
| 2,798,989 | 7/1957 | Welker | 317/237 |
| 3,124,936 | 3/1964 | Melehy | 62/3 |
| 3,259,759 | 7/1966 | Giaever | 307/88.5 |
| 3,296,033 | 1/1967 | Scuro et al. | 136/205 |
| 3,338,753 | 8/1967 | Horsting | 136/237 |
| 3,342,567 | 9/1967 | Dingwall | 29/195 |
| 3,626,583 | 12/1971 | Abbot et al. | 29/573 |
| 3,674,568 | 7/1972 | Caprarola | 136/205 |
| 3,873,370 | 3/1975 | Hampl, Jr. et al. | 136/205 |
| 4,029,520 | 6/1977 | Hampl, Jr. | 136/205 |
| 4,261,771 | 4/1981 | Dingle et al. | 148/175 |
| 4,368,416 | 1/1983 | James | 322/2 R |
| 4,469,977 | 9/1984 | Quinn et al. | 310/334 |
| 4,620,897 | 11/1986 | Nakajima | 156/602 |
| 4,664,960 | 5/1987 | Ovshinsky | 428/98 |
| 4,786,335 | 11/1988 | Knowles et al. | 136/214 |
| 4,847,666 | 7/1989 | Heremans et al. | 357/16 |
| 4,855,810 | 8/1989 | Gelb et al. | 357/87 |
| 4,869,971 | 9/1989 | Nee et al. | 428/635 |
| 5,006,178 | 4/1991 | Bijvoets | 136/211 |
| 5,021,224 | 6/1991 | Nakajima | 422/248 |
| 5,051,786 | 9/1991 | Nicollian | 357/4 |
| 5,064,476 | 11/1991 | Recine, Sr. | 136/201 |
| 5,156,004 | 10/1992 | Wu et al. | 62/3.1 |
| 5,181,086 | 1/1993 | Yoshida | 257/18 |
| 5,210,428 | 5/1993 | Goossen | 257/17 |
| 5,288,336 | 2/1994 | Strachan et al. | 136/200 |

FOREIGN PATENT DOCUMENTS 1216001 12/1970 United Kingdom ............. 136/236.1

OTHER PUBLICATIONS

T. E. Whall and E. H. C. Parker, in *Proc. First European Conf. on Thermoelectrics*, D. M. Rowe, ed. (Peter Peregrinus Ltd., London, 1987), pp. 51-63.

"Solid-State Superlattices" by Gottfried H. Döhler, Nov. 1983, pp. 144-151.

*Primary Examiner*—Donald P. Walsh
*Assistant Examiner*—Chrisman D. Carroll
*Attorney, Agent, or Firm*—Baker & Botts

[57] ABSTRACT

A superlattice comprising alternating layers of $(PbTe\text{-}Se)_m$ and $(BiSb)_n$ (where m and n are the number of PbTeSe and BiSb monolayers per superlattice period, respectively) having engineered electronic structures for improved thermoelectric cooling materials (and other uses) may be grown by molecular beam epitaxial growth. Preferably, for short periods, $n+m<50$. However, superlattice films with 10,000 or more such small periods may be grown. For example, the superlattice may comprise alternating layers of $(PbTe_{1-z}Se_z)_m$ and $(Bi_xSb_{1-x})_n$. According to a preferred embodiment, the superlattice comprises a plurality of layers comprising m layers of $PbTe_{0.8}Se_{0.2}$ and n layers of $Bi_{0.9}Sb_{0.1}$, where m and n are preferably between 2 and 20.

14 Claims, 1 Drawing Sheet

SUPERLATTICE STRUCTURES PARTICULARLY SUITABLE FOR USE AS THERMOELECTRIC COOLING MATERIALS

U.S. GOVERNMENT INTEREST

This invention was developed pursuant to research sponsored in part by the U.S. Government under Department of the Air Force Contract No. F19628-90-C-0002, and the U.S. Government may have certain rights in the invention.

FIELD OF THE INVENTION

The invention relates to superlattice structures and specifically to such structures which are particularly useful as thermoelectric cooling materials.

BACKGROUND OF THE INVENTION

Superlattice structures, in general, are known and typically comprise a composite made of alternating ultrathin layers of different materials. Typically, the superlattice has an energy band structure which is different than, but related to, the energy band structure of the component materials. By the appropriate choice of materials (and other factors discussed below), a superlattice having a desired energy band structure and other characteristics can be produced.

Superlattices have many uses, including, but not limited to, use in the field of thermoelectric cooling materials. Whall and Parker have suggested using a superlattice prepared by molecular beam epitaxy (MBE) to enhance the thermoelectric figure of merit of a thermoelectric material. They expressed particular interest in silicon and SiGe alloys, but also mentioned the possibility of using PbTe, InAs and the transition silicides (e.g. $CoSi_2$). Specifically, a strained-layer superlattice consisting of 20 or more layers of Si and SiGe composition was suggested.

The use of MBE to grow superlattice structures (e.g., GaAs and AlAs) is disclosed in U.S. Pat. No. 4,261,771 issued to Dingle, et al. As disclosed in Dingle et al., the general technique for fabricating a superlattice by MBE comprises the following standard steps: (1) obtaining a substrate (e.g., from a commercial source); (2) cleaning a major surface of the substrate using standard preparation procedures; (3) placing the substrate in an evacuable metal chamber; (4) reducing the chamber pressure; (5) loading shuttered effusion cells (ovens) with the requisite source materials for growth; (6) heating the substrate to about 600 degrees C., to cause desorption of contaminants from the growth surface and then adjusting the substrate temperature to that desired for growth; (7) with the shutters closed, heating the ovens until the source materials vaporize; and (8) opening selected shutters to effect growth until the desired layer thickness is attained.

According to Dingle et al., the fabrication process can be described as forming a new composition of matter of A (e.g., GaAs) and B (e.g., AlAs or Ge) by directing a periodically pulsed molecular beam at a substrate. During the first part of each period an A-beam is directed at the substrate for a time effective to grow material A having a thickness of n monolayers and during the second part of each period directing a B-beam at the substrate for a time effective to grow material B having a thickness of m monolayers.

Therefore, the fabrication of a superlattice by MBE, or other known epitaxial growth techniques, is generally known. However, the choice of materials and the relative amounts of the materials which make up the superlattice are predominant factors in determining the characteristics of the superlattice. For use as a thermoelectric material, it is desirable to choose the materials, and their relative amounts, so that the thermoelectric figure of merit is maximized.

The thermoelectric cooling figure of merit (ZT) is a measure of the effectiveness of a cooling material and is related to material properties by the following equation:

$$ZT = S^2 \sigma T/\kappa, \qquad (1)$$

where S, $\sigma$, $\kappa$, and T are the Seebeck coefficient, electrical conductivity, thermal conductivity and temperature, respectively. The Seebeck coefficient (S) is a measure of how readily electrons (or holes) can change energy in a temperature gradient as they move across a thermoelement, and is related to the strength of interaction of charge carriers with the lattice and the available energy states. The highest useful Seebeck coefficients are found in semiconductor materials with low crystal symmetry. In theory, to maximize ZT, one would try to maximize S, $\sigma$ and T and minimize $\kappa$. However, in practice, this is not so simple. For example, as a material is doped to increase its electrical conductivity ($\sigma$), bandfilling tends to lower S and the electron component $\kappa_e$ of $\kappa$ increases. In most materials, ZT is maximized at doping levels approaching $10^{19}$ cm$^{-3}$. Since increasing (or decreasing) one parameter may adversely increase (or decrease) another parameter, it is important to select carefully the component materials to provide a high ZT. Currently, the best thermoelectric cooling materials have a ZT of approximately 1, at 300 K.

The figure of merit ZT is related to the thermoelectric materials factor (b*) where:

$$b^* = \mu m^{*3/2}/\kappa_L; \qquad (2)$$

where $\mu$ is the carrier mobility, m* is the density of states effective mass and $\kappa_L$ is the lattice thermal conductivity. The precise relationship between b* and ZT is complex. However, for simplicity, it may be approximated as follows. If it assumed that $b^{**} = b^* T^{5/2}$ and that there is one-band conduction, then ZT increases monotonically as b** increases.

A superlattice provides the opportunity to enhance ZT for a number of reasons. For example, it is known that the Seebeck coefficient increases as the period of a quasi-two-dimensional superlattice decreases. The electrical conductivity may be enhanced by means of modulation doping, which has been shown to increase the carrier mobilities in Si/SiGe strained-layer superlattices. Furthermore, the lattice thermal conductivity of a small-period superlattice is expected to be substantially lower than the average of the component materials because of augmented Umklapp phonon-phonon scattering process (in which the total phonon vector is not conserved, but rather changes by $2\pi$ times the reciprocal lattice vector) due to phonon-interface scattering effects.

Multistage thermoelectric modules, which are used, for example, to cool different types of infrared imaging arrays (and for a number of other well known applications), are well known. Typically, however, they are limited to cold-sink temperatures greater than 160 K. Thermoelectric cooling materials, for example, $Bi_2Te_3$ and BiSb were researched 30 to 40 years ago. Unfortunately, the best currently known production thermoelectric material, $Bi_2Te_3$, is not capable of efficient heat removal below approximately 180 K. and has a ZT less than 1.

SUMMARY OF THE INVENTION

It is an object of the present invention to overcome these and other drawbacks of the prior art.

It is another object of the invention to provide a new superlattice structure which is made of a novel combination of materials and which has a new and distinct energy band structure.

It is another object of the invention to provide a new thermoelectric cooling material which has a thermoelectric cooling figure of merit greater than 1.7 and, preferably, approximately 3.2.

In order to accomplish these and other objects of the present invention, there is provided a short-period superlattice structure comprising alternating layers of component materials which already have reasonably good thermoelectric characteristics. The selection of materials may include consideration of many variables such as band structure, electron affinity, lattice constant match, coefficient of expansion match, and inherent thermoelectric properties (e.g., at 300 K.) for the components of the superlattice. The superlattice (SL) can be engineered to have an optimal band gap for the particular application. For thermoelectric cooling materials, an energy band gap of between 0 and 8 kT, and preferably 4 kT, is desired, where k is Boltzmann's Constant and T is temperature. The optimum band gap will result in the enhancement of transport effects of the desirable multivalley L-conduction band and the elimination or minimization of the degrading effects of the extraneous T-valence band. Preferably, the superlattice is a short-period superlattice alloy structure having two components which are not psuedomorphic but have slightly different crystal structures (e.g. face-centered cubic versus rhombohederal).

A short period superlattice (SPS) is a compositionally modulated, periodic structure, consisting of alternate layers of two distinct phases (materials). The materials may consist of one semiconductor and one semimetal, two semiconductors or two semimetals, but should have a superlattice period in thickness shorter than the electron (hole for p-type) carrier mean free path. Also, the SPS should have a potential provided by the layered structure, which significantly modifies the band structure of either component material. Furthermore, the regular array of phase interfaces should alter the phonon spectra so that the lattice thermal conductivity will be lower than that of either component. Therefore, the basic physical properties of the SPS (such as thermopower, electrical resistivity and thermal conductivity) are different from either of the original materials and favorable for a high thermoelectric figure of merit ZT.

Preferably, the superlattice is made of component materials which have a large number of relatively heavy atoms. A large number of relatively heavy atoms is advantageous for the achievement of a low lattice thermal conductivity ($\kappa_L$). Preferably, the materials comprise elements chosen from the lower center section of the Periodic Table. Elements from the lower center section of the Periodic Table tend to have relatively large carrier mobilities ($\mu$), which is advantageous for high electrical conductivities ($\sigma$).

According to one aspect of the invention, a superlattice is provided having one or more of the following characteristics: an energy band gap of about 0–8 kT; a density of states effective mass of greater than 0.05, a lattice thermal conductivity less than 10 mWcm$^{-1}$K$^{-1}$ and a b* greater than 40,000 cm$^3$KW$^{-1}$V$^{-1}$s$^{-1}$ (at 300 K.). For example, to provide a superlattice with a ZT of approximately 3.2, it may have the following approximate 300 K. properties: $\kappa_L = 0.0020$ W/cm K, $\kappa_e = 0.0022$ W/cm K, $S = 350$ $\mu$V/K and $\sigma = 370$ $\Omega^{-1}$cm$^{-1}$.

For example, a superlattice according to the present invention may be made of alternating layers of two distinct materials where one material comprises Bi, a Bi alloy or Bi and (at least one material selected from the group consisting of Pb, Sn, Ge, Te, Se, S, Sb, As or P) and where the other material comprises materials selected from the group consisting of Pb, Sn, Ge, Te, Se, S, Sb, As or P.

For example, but without limitation, the superlattice may be made of alternating layers of $L_{1-y}M_yD_zJ_{1-z}$ and $Bi_xR_{1-x}$;

where L is a material selected from the group of Europium (Eu) or Strontium (Sr),
M is a metal selected from Group IV (preferably Pb, Sn or Ge), D is a non-metal selected from Group VI (preferably Te, Se or S), J is a non-metal selected from Group VI (preferably Te, Se or S), R is a Group V material (preferably Sb, As or P); and where $0 \leq x \leq 1$, $0 \leq y \leq 1$ and $0 \leq z \leq 1$.

Specifically, the superlattice preferably comprises alternating layers of $PbTe_{1-z}Se_z$ and $Bi_xSb_{1-x}$. According to a preferred embodiment, the superlattice comprises m layers of $PbTe_{0.8}Se_{0.2}$ and n layers of $Bi_{0.9}Sb_{0.1}$, where m and n are preferably between 2 and 20. However, the invention is not so limited. Other combinations and amounts of materials may be used.

A superlattice made of alternating layers of BiSb (e.g. $Bi_{0.9}Sb_{0.1}$) and PbTeSe (e.g. $PbTe_{0.8}Se_{0.2}$) (or similar materials) is believed to be particularly advantageous for several reasons. For example, at low temperatures BiSb can have ZT values comparable to that of $Bi_2Te_3$ alloys at room temperature and PbTeSe is also a good thermoelectric material which may be lattice-matched to BiSb. Additionally, both PbTeSe and BiSb have multivalley conduction bands with relatively large density-of-states effective masses and favorable carrier-scattering mechanisms, which tend to yield unusually high Seebeck coefficients.

A short-period superlattice enhances ZT for several reasons. The short-range disorder and the multiplicity of interfaces increases the phonon scattering over the entire spectrum of phonon frequencies. Additionally, a large number of different heavy atoms (e.g. five for PbTeSe/BiSb) will act as point defects and scatter mainly high frequency phonons. Furthermore, phonon-electron interactions will scatter the phonons mainly at low frequencies. The combined three effects will substantially reduce the lattice component of the thermal conductivity ($\kappa_L$) and thereby increase ZT.

Moreover, a short-period SL can be engineered to have an optimal band gap, e.g., a value between the value of BiSb and the value for PbTeSe, which will result in the enhancement of ZT because of the minimization of the harmful effects of the T valence band of BiSb. Additionally, both modulation doping effects and the long-range order of a good-quality SL enhance the electron carrier mobility and hence increase electrical conductivity, which will also increase ZT.

Bi$_2$Te$_3$ alloys are considered by many to be the best conventional thermoelectric materials and have a rhombohedral crystal structure with a large c/a ratio (~7). However, they have a large lattice constant mismatch with most other good thermoelectric materials. This may be undesirable in some instances. Preferably, the average lattice constants of the two components of the SL structure of the present invention are matched in the growth plane, but not necessarily in the direction perpendicular to the growth plane, thereby producing coherent growth and excellent thermoelectric transport properties due to the minimization of defects at the interfaces.

According to one aspect of the invention, a superlattice is synthesized from those materials by epitaxial growth, for example, by using molecular beam epitaxy or organometallic vapor-phase epitaxy (OMVPE). Depending on the choice of materials, other techniques such as liquid-phase epitaxy or sputtering may also be desired.

DETAILED DESCRIPTION OF THE PREFERRED EMBODIMENTS

The present invention relates to novel superlattice structures which may be used for various purposes including, but without limitation, thermoelectric cooling, electronic devices and electrooptic devices. For example, a superlattice according to the present invention may be made of alternating layers of a first material and a second material, where the first material comprises Bi or Bi alloy (e.g., Bi and a material selected from the group consisting of Pb, Sn, Ge, Te, Se, S, Sb, As or P) and where the second material comprises materials selected from the group consisting of Pb, Sn, Ge, Te, Se, S, Sb, As or P. For example, but without limitation, the superlattice may be made of alternating layers of $L_{1-y}M_yD_zJ_{1-z}$ and $Bi_xR_{1-x}$;

where L is a rare metal selected from the group of Europium (Eu) or Strontium (Sr), M is a metal selected from Group IV (preferably Pb, Sn or Ge), D is a non-metal selected from Group VI (preferably Te, Se or S), J is a non-metal selected from Group VI (preferably Te, Se or S), R is a Group V (preferably Sb, As or P); and where $0 \leq x \leq 1$, $0 \leq y \leq 1$ and $0 \leq z \leq 1$.

A superlattice comprising alternating layers of (PbTeSe)$_m$ and (BiSb)$_n$ (where m and n are the number of PbTeSe and BiSb monolayers per superlattice period, respectively) having engineered electronic structures for improved thermoelectric cooling materials (and other uses) may be grown by molecular beam epitaxial growth. Preferably, for short-periods, n+m<50. However, superlattice films with 10,000 or more such small periods may be grown. For example, the superlattice may comprise alternating layers of (PbTe$_{1-z}$Se$_z$)$_m$ and (Bi$_x$Sb$_{1-x}$)$_n$. According to a preferred embodiment, the superlattice comprises a plurality of layers comprising m layers of PbTe$_{0.8}$Se$_{0.2}$ and n layers of Bi$_{0.9}$Sb$_{0.1}$, where m and n are preferably between 2 and 20. However, the invention is not so limited. Other combinations and amounts of similar materials may be used. According to a preferred embodiment, molecular beam epitaxy (MBE) may be used to grow PbTe$_{0.8}$Se$_{0.2}$ and Bi$_{0.9}$Sb$_{0.1}$ on (111) BaF$_2$ substrates at substrate temperatures in the range of 100° to 250° C.

Figure 1:
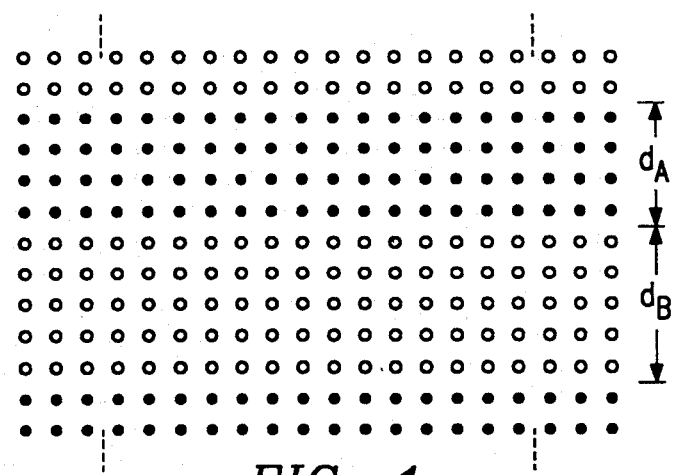
FIG. 1 is a schematic illustration of the monolayers of two distinct materials of a superlattice according to the present invention.

One advantage of using a superlattice for thermoelectric cooling elements is that the energy gap of the L-point bands as well as the other bands can be engineered. A schematic arrangement of the monolayers of the superlattice is shown in FIG. 1. In the limit of layer thicknesses of the order of a few monolayers, the energy gap of the superlattice $E_g^{sl}$ can be approximated by the equation:

$$E_g^{sl} = \{E_{gA}d_A + E_{gB}d_B\}/(d_A + d_B), \quad (3)$$

where $E_{gA}$ and $E_{gB}$ are the band gap energies of the two materials (e.g., PbTeSe and BiSb), respectively, and $d_A$ and $d_B$ are the layer thicknesses of the materials (e.g., PbTeSe and BiSb), respectively. According to a preferred embodiment, if it is desired that $E_g^{sl} \approx 0.1$ eV (which corresponds approximately to 4 kT at 300 K.), then since $E_{gA}$ and $E_{gB}$ are 0.30 eV and −0.05 eV, respectively, the BiSb layer should be somewhat thinner than the PbTeSe layer. Additionally, an even number of monolayers of PbTeSe is preferred to maintain stoichiometry. Therefore, if, for example, a superlattice period of 9 monolayers is small enough to produce the desired band changes, a superlattice consisting of 4 monolayers of PbTeSe and 5 monolayers of BiSb should have optimal thermoelectric properties. The thickness of a monolayer in the [111] direction is 0.3692 and 0.3929 nm for PbTeSe and BiSb, respectively. For a period of 9 monolayers (as specified above), $d_A = 1.4768$ nm and $d_B = 1.9645$ nm, and Eq. (3) yields $E^{sl} = 0.10$ eV.

The PbTeSe/BiSb superlattice is also advantageous because it is lattice-matched in the (111) plane. For example, the Bi$_{0.9}$Sb$_{0.1}$ and PbTe$_{0.8}$Se$_{0.2}$ alloys are lattice-matched at the expected superlattice growth temperature of about 250° C. However, it is only necessary to lattice match in the growth plane for coherent growth and minimization of defects at the interfaces.

The L-band extrema of BiSb is very favorable for high ZT, since it is highly anisotropic. Its low-effective-mass directions correspond to a high electron mobility ($\mu$), and its high-mass directions cause a relatively large density-of-states effective mass (m*). The high value of m* leads to a high Seebeck coefficient because, for a fixed carrier concentration, the Fermi level energy decreases with increasing m*. Also, there are three equivalent L bands with three valley extrema belonging to the L-minima, which is favorable for high ZT because m* is directly proportional to the number of valleys. The T and H or $\Sigma$ valence bands of BiSb are less favorable because of their relatively low carrier mobilities and nearly isotropic nature (single valley). The deleterious effects of the T and H valence bands can be minimized or eliminated by the use of short period superlattice (e.g., PbTeSe/BiSb), so that the inherently high ZT value of the L conduction and valence bands of BiSb can be realized.

The L bands of PbTeSe are also favorable since they have good anisotropy and four equivalent valleys. Both PbTeSe and BiSb have low lattice thermal conductivities ($\kappa_L$) at 300 K. From a physics point of view, the BiSb/PbTeSe superlattice has enhanced thermoelectric properties. In addition, from a crystal growth point of view the system is ideal for thermoelectric materials development. For example, the PbTe-PbSe pseudobinary system forms a continuous series of solid solutions. The liquidus and solidus part of the phase diagram form a minimum at the composition of PbTe$_{0.8}$Se$_{0.2}$ which is advantageous for the preparation of compositionally homogenous MBE source materials.

The superlattice provides a unique opportunity to create made-to-order energy gaps, phonon spectra and Fermi surfaces by controlling the energy and bandwidth of the subbands, which are determined by the barrier and well thicknesses and the barrier height. The barrier and well thicknesses are adjustable MBE growth parameters, whereas the barrier heights can be varied by choosing closely related pseudobinary alloys, such as PbEuTeSe, PbSrTeSe, etc.

Many parameters of the growth process will be subject to optimization. These include, for example, impurity doping, layer thickness, deposition temperatures, growth rate, beam vapor pressures, etc.

The relationship between the molecular beam flux monitoring pressure and the epitaxial growth rate for both PbTeSe and BiSb has been calculated and measured experimentally to be the following:

$$G_r(\mu m/hr) = P(Torr)/2 \times 10^{-6}$$

where $G_r$ is the epitaxial growth rate and P is the beam flux monitoring vapor pressure. The above equation is applicable in the 1 to 3 $\mu$m/hr. The calculated growth rates compare reasonably well with those obtained by cleaving the MBE grown layers and using an optical microscope to measure the layer thickness. The measured growth rate is calculated as the ratio of the layer thickness to the growth time.

Epitaxial growth methods in general are well known and can be used for growing the superlattices. For example, the superlattice may be grown by MBE on cleaved or polished single-crystal BaF$_2$ substrates. BaF$_2$ has a [111]-oriented cleavage plane and a crystal lattice constant of 6.200 Å at room temperature, which is relatively close to that of both PbTeSe and BiSb (in its trigonal orientation). Thus, BaF$_2$ is a viable substrate for the BiSb/PbTeSe superlattice. Other substrates may be used however. After growth, the superlattice layers can be easily removed from the BaF$_2$ substrate by any one of several known techniques.

Preferably, the superlattice will have carrier concentrations less than $1 \times 10^{17}$cm$^3$ and bulk carrier mobilities for each component of the layered structure on large area polished substrates. The relatively low carrier concentrations are preferable for at least the BiSb component of the superlattice for high Seebeck coefficients (>350 $\mu$V/K at 300 K.). The high carrier mobilities are preferred for high electrical conductivity (>350 $\mu^{-1}$cm$^{-1}$ at 300 K.).

The interdiffusion coefficient of PbTeSe/BiSb should be small because the five different atoms are large and diffuse substitutionally rather than interstitially. Nevertheless, knowledge of the diffusion coefficient is important for setting upper limits on the epitaxial growth temperatures and on thermal process times and temperatures. Secondary-ion-mass spectroscopy may also be used to assess impurity cross-contamination. Modulation doping of the superlattice where the wide-gap PbTeSe layers are doped with impurities and the narrow-gap BiSb layers are left undoped may be desired.

Figure 2:
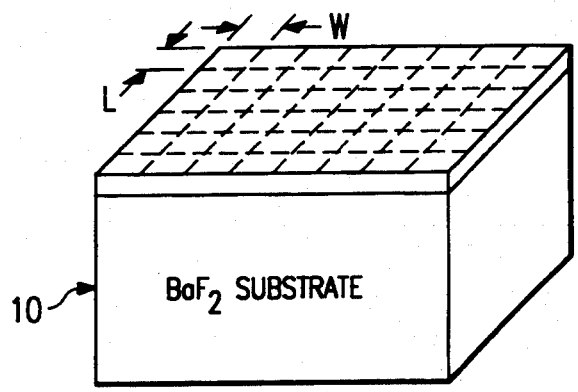
FIG. 2 is a schematic illustration of preparing superlattice chips for assembly into bulk thermoelements.
Figure 3:
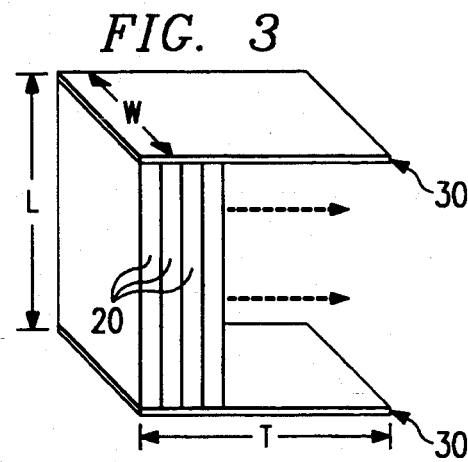
FIG. 3 is a schematic illustration of a plurality of superlattice chips assembled as a bulk thermoelement.

As shown, for example, in FIG. 2, the MBE-grown layered structures may be assembled into bulk thermoelements for cooling modules by removing the substrate 10, cutting the chips into a predetermined size having a length L and a width W (e.g. 2×2 mm), stacking and bonding (e.g. by soldering 30) the chips into small cubically-shaped thermoelectric cooling elements 20 having a thickness T, as shown, for example, in FIG. 3. The process of forming thermoelements, per se, is well known.

Figure 4:
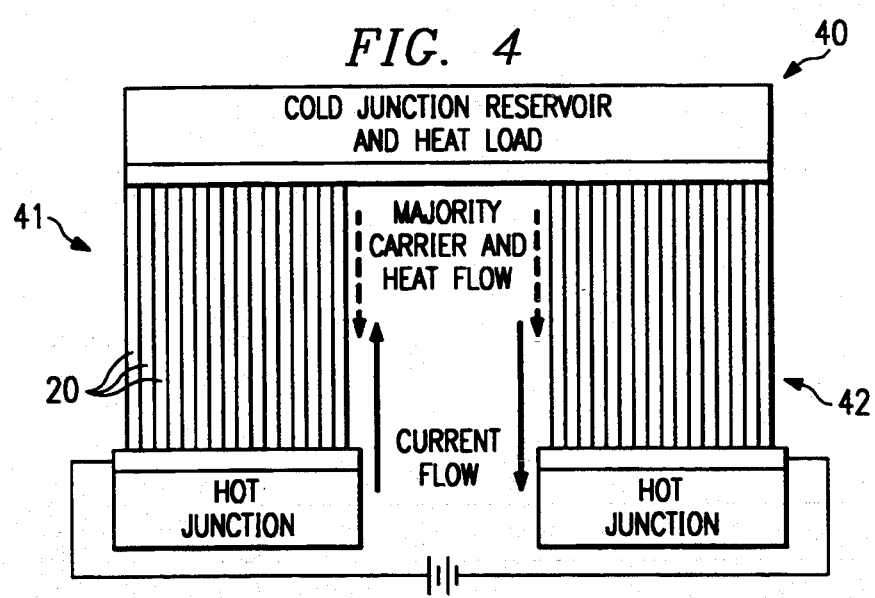
FIG. 4 is an example of a thermoelectric cooling module according to one embodiment of the present invention.

From these cubes, thermoelectric cooling modules can be fabricated. For example, n-type superlattice structures 20 may be used as the n-type leg 41 of a multistage thermoelectric module, as shown for example in FIG. 4. Thermoelectric modules using this new type of material may be used for various purposes, including, for example, commercial refrigeration and air-conditioning equipment, the development of cryogenic coolers for infrared thermal imaging, superconductive electronics, and other quantum device applications.

While multiple n-type and p-type thermoelement pairs in each stage of a multistage unit have been required for cryogenic coolers, it may not be necessary to develop a new p-type leg for high-performance modules. For example, in view of the superiority of the n-type thermoelements, the p-type leg 42 of FIG. 4 may be replaced by a passive thermoelement, e.g., one that has close to zero Seebeck coefficient but which has a high ratio of electrical to thermal conductivity. It is known that the Seebeck coefficient is zero in superconductors but the ratio of the electrical to thermal conductivity is infinite. Consequently, a thermoelectric module or stage made with the new n-type superlattice thermoelement and a superconductor has a ZT precisely that of the n-type superlattice thermoelement. A multistage cooler using n-type superlattice thermoelements can be made with stages operating above ~120 K. having p-type legs of conventional Bi$_2$Te$_3$ or BiSb alloys (or other suitable material) and still have an effective ZT of 2.1 and stages operating below ~120 K. having superconductor legs and have an effective ZT of 3.2. Thus, a matching p-type superlattice leg may not be needed to provide a 300 to 77 K. thermoelectric cooler.

The realization of a ZT of 3.2 over the entire multistage cooler temperature range is adequate to accomplish thermoelectric cooling from room temperature to 77 K. It will also greatly expand the commercial refrigeration and cooling applications for thermoelectric coolers. Many other uses and advantages will also be readily apparent to one of ordinary skill in the art.

While PbTeSe/BiSb was discussed as a preferred combination of materials, various other combinations of materials are within the scope of the invention. Specifically, other materials which exhibit characteristics similar to the advantageous characteristics discussed above are within the scope if the invention. In general, it is preferred that at least one of the layers comprise PbTeSe, PbTe, SnSe, SnTe, TeSe, Bi$_2$Te$_3$, Bi, BiSb or their alloys. Without limiting the invention, the following are some specific examples of combinations of materials which may also be used:

Bi and Bi$_2$Te$_3$
Bi$_{0.88}$Sb$_{0.12}$ and Bi
Bi$_{0.87}$Sb$_{0.12}$As$_{0.01}$ and Bi$_{0.93}$Sb$_{0.06}$As$_{0.01}$
Bi$_2$Te$_3$ and PbTe SbTe and BiTe (or another Bi alloy)
AgSbTe and BiSb (or another Bi alloy)
CdSb and BiSb (or another Bi alloy)

While the foregoing is a description of an example of the preferred embodiments of the present invention, various alternatives will be readily apparent to one of ordinary skill in the art. The invention is only limited by the claims appended hereto.

I claim:

1. A superlattice comprising a plurality of alternating layers of a first material comprising $D_zJ_{1-z}$ and a second material comprising Bi;
    where D is a Group VI non-metal selected from the group consisting of Te, Se and S;
    J is a Group VI non-metal selected from the group consisting of Te, Se and S;
    D is not the same as J; and
    $0 \leq z \leq 1$.

2. The superlattice of claim 1 having an energy gap between 0 kT and 10 kT:
    where k is Boltzman's constant and T is temperature.

3. The superlattice of claim 1 having at least one of the following properties:
    a density of states effective mass less than 0.05;
    a lattice thermal conductivity less than 10 $mWcm^{-1}K^{-1}$ and a materials factor (b*) greater than 40,000 $cm^3kW^{-1}V^{-1}S^{-1}$.

4. The superlattice of claim 1 having thermoelectric figure of merit greater than approximately 1.7.

5. The superlattice of claim 1 having a thermoelectric figure of merit greater than approximately 2.0.

6. The superlattice of claim 1 having a thermoelectric figure of merit greater than approximately 2.5.

7. The superlattice of claim 1 having a thermoelectric figure of merit greater than approximately 3.0.

8. The superlattice of claim 1 having a thermoelectric figure of merit approximately equal to 3.2.

9. The superlattice of claim 1 wherein the layer thickness of the respective first and second materials and the number of layers of the first and second materials within a period of the superlattice are formed such that $E_g^{sl}$ is approximately in the range of 0 kT to 8 kT, where k is Boltzman's constant, T is temperature and $E_g^{sl} = \{E_{gA}d_A + E_{gB}d_B\}/(d_A+d_B)$;
    where $E_g^{sl}$ is the energy gap of the superlattice, $E_{gA}$ and $E_{gB}$ are the energy gaps of the first and second materials, respectively, and $d_A$ and $d_B$ are the layer thicknesses of the first and second materials, respectively.

10. A superlattice comprising a predetermined number of alternating layers of two component materials, where one of the component materials comprises TeSe and the other component material comprises Bi.

11. A thermoelectric module comprising:
    a plurality of thermoelectric chips which are stacked and bonded, wherein said thermolectric chips comprise a superlattice according to claim 1.

12. A thermoelectric device comprising:
    an n-type leg;
    a second leg operatively connected to said n-type leg for thermoelectric cooling;
    wherein said n-type leg comprises a thermoelectric module according to claim 11.

13. A thermoelectric device according to claim 12 wherein said second leg comprises a p-type leg.

14. A thermoelectric device according to claim 12 wherein said second leg comprises a superconductor material.

* * * * *